April 8, 1958 R. A. GUDMUNDSEN 2,829,999

FUSED JUNCTION SILICON SEMICONDUCTOR DEVICE

Filed March 30, 1956

RICHARD A. GUDMUNDSEN,
INVENTOR

BY [signature]
ATTORNEY 2,829,999

FUSED JUNCTION SILICON SEMICONDUCTOR DEVICE

Richard A. Gudmundsen, Inglewood, Calif., assignor to Hughes Aircraft Company, Culver City, Calif., a corporation of Delaware Application March 30, 1956, Serial No. 575,239

6 Claims. (Cl. 148—33)

The present invention relates to fused junction semiconductor devices, and more particularly to a method of creating an acceptor impurity-doped region in a silicon semiconductor crystal.

In the semiconductor art a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous, solid specimen of semiconductor material has an N-type region adjacent a P-type region, the boundary between the two regions is termed a P–N (or N–P) junction, and the specimen of semiconductor material is termed a P–N junction semiconductor device. Such a P–N junction device may be used as a rectifier, photocell, or the like. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term "active impurity" is used to denote those impurities which affect the electrical rectification characteristics of semiconductor material such as silicon or germanium. These impurities are to be distinguished from other impurities which have no appreciable effect on the above referred to characteristics. Active impurities are ordinarily classified either as donor impurities, such as phosphorus, arsenic, and antimony, or as acceptor impurities, such as boron, aluminum, gallium, and indium.

The term "solvent metal" is used in this specification describing those materials which when in liquid state become solvent for the semiconductor material which is under consideration, herein silicon, and which will therefore dissolve areas of semiconductor material which are in contact with the solvent metal. A solvent metal may be a primary element, or it may be an alloy.

As is well known in the art, the monatomic semiconductor crystal region between opposed P–N junctions is termed the "base" region of a fused junction transistor. The first regrown region, having a conductivity type opposite to that conductivity type of the body region is termed the "emitter" of the transistor. The second regrown crystal region, having a conductivity type identical to the conductivity type of the first region and opposed to the conductivity type of the base region is termed the "collector" region of the transistor.

In the prior art it is well known to produce a fused junction diode or transistor by fusing to a silicon starting specimen a small amount of low melting-point active impurity. According to this method a predetermined amount of a low melting-point acceptor impurity such as aluminum, for example, is placed in contact with a surface of a silicon semiconductor starting specimen.

The specimen and the acceptor impurity are then heated to a value of temperature above the melting point of the active impurity, but below the melting point of the silicon in order to melt the active impurity and dissolve therein a portion of the adjacent silicon specimen. The specimen is then cooled so that the dissolved silicon and atoms of the active impurity are regrown onto the specimen.

If an N-type silicon starting specimen is used in the above-described method then a P–N junction will be produced therein with the fusion of the acceptor impurity resulting in a basic diode framework. Should this procedure be twice repeated on either side of the N-type silicon starting specimen, a basic transistor framework will be produced, i. e., two P-type regions will be separated by an N-type region. On the other hand, should a P-type silicon starting specimen by employed in the above-described method then an ohmic contact will be produced by the regrown P-type region.

An electrical conductor ohmically connected to any of the three regions may be formed by the same fusion technique employed to regrow a basic N-type conductivity region to a P-type region, this by taking a starting P-type crystal and regrowing therein another P-type region which will then act as an ohmic contact to the starting P-type crystal, or vice versa.

A diode or transistor produced by the herein disclosed method while satisfactory for many purposes has a relatively high resistivity in the regrown region which is often undesirable.

Another disadvantage inherent in a device produced by the above-disclosed method using aluminum as the active impurity is that the resistivity of the regrown region often varies with depth.

Accordingly, it is an object of this invention to provide a new method for producing a fused junction in a silicon semiconductor device with a very low resistivity regrown region.

It is a further object of this invention to provide a new alloy as an active impurity for doping a regrown region in a silicon semiconductor starting specimen to produce a uniform resistivity regrown region.

It is still another object of this invention to provide a fused junction silicon device with a regrown region of very low resistivity.

It is yet another object of this invention to provide a fused junction silicon semiconductor device which has a very low resistivity regrown region which resistivity is uniform with depth.

The method of the present invention comprises the step of using a boron-aluminum alloy as the acceptor active impurity to produce the regrown region in a silicon semiconductor starting specimen.

The novel features which are believed to be characteristic of the invention, both as to its organization and method of operation, together with further objects and advantages thereof, will be better understood from the following description considered in connection with the accompanying drawing, in which one embodiment of the invention is illustrated by way of example. It is to be expressly understood, however, that the drawing is for the purpose of illustration and description only, and is not intended as a definition of the limits of the invention.

Figure 1:
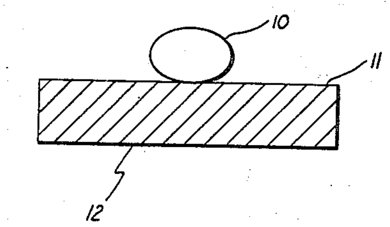
Fig. 1 is a schematic cross-sectional view of a silicon semiconductor wafer just prior to the fusion step.

Referring now to the drawing, there is shown in Fig. 1 an alloy pellet 10 situated on surface 11 of silicon semiconductor wafer 11. Pellet 10 contains an alloy comprising aluminum and boron, the ratio of one to the other will hereinafter be discussed. The pellet 10 may also contain a solvent metal which will aid in the dissolution of the silicon adjacent pellet 10 upon heating of the pellet and wafer assembly. An example of such a solvent metal is bismuth.

Assuming that the wafer 12 is initially of N-type conductivity, then upon heating of the wafer and pellet combination, by an apparatus not shown, the pellet 10 will melt. It should be pointed out that the temperature to which the pellet-wafer combination is raised while it is above the melting point of the pellet is below the melting point of the silicon wafer. However, the constituency of the pellet is selected to provide an alloy, which when molten readily dissolves silicon. Accordingly, when the alloy pellet 10 is melted, it dissolves the adjacent region of the silicon wafer 12 and forms an alloy with the dissolved silicon.

Figure 2:
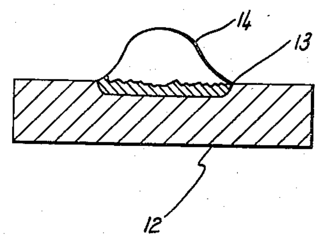
Fig. 2 is a cross-sectional view of the silicon starting wafer of Fig. 1 just after the fusion step has been carried out.

After the molten alloy pellet has substantially reached equilibrium at a predetermined temperature and has dissolved the desired amount of silicon, the combination of the wafer and the dependent alloy region is then cooled at a predetermined rate to redeposit or precipitate a portion of the dissolved silicion onto the adjacent N-type conductivity wafer, thereby producing a regrown region in the silicon crystal specimen. The aluminum and boron atoms contained in the alloy pellet 10, together with some of the dissolved silicon which has precipitated, are incorporated in the regrown region 13 of wafer 12, as shown in Fig. 2. Thus a P-type region 13 is produced within crystal wafer 11, thereby producing a first P–N junction.

As the cooling process is continued, a value of temperature is reached whereat the remainder of the molten alloy of silicon, solvent metal (if any is present) and acceptor impurity, i. e., aluminum and boron, tends to solidify as an alloy button affixed to the regrown P-type region as seen in Fig. 2. Thus, as the wafer-pellet combination is cooled thereafter, the remainder of the molten alloy adjacent the regrown P-type region 13 is solidified as an alloy button 14 which is connected to the P-type region.

It should be pointed out here that if wafer 12 is originally of P-type conductivity and the above procedure is followed, an ohmic contact will be established between the wafer 12 and regrown region 13.

It has been found that the thickness of the regrown region 13 can be controlled by regulating two factors, namely, the depth of penetration of the alloy pellet 10 into the silicon specimen, or in other words the amount of silicon dissolved, and the amount of dissolved silicon regrown onto the starting wafer 12 during the cooling period. It has further been found that the amount of silicon dissolved by the alloy pellet 10 is a function of the constituency of the alloy, the equilibrium temperature at which the fusion process is carried out, the mass of the alloy pellet, and the duration of the fusion process.

Figure 3:
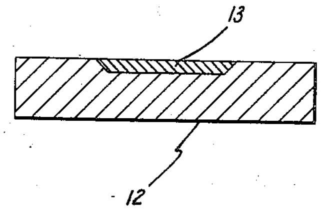
Fig. 3 is a cross-sectional view of the device of Fig. 2 in a further intermediate stage of manufacture.

In Fig. 3 there is shown a cross-sectional view of the device of Fig. 2 as it would appear after the alloy button 14 has been removed, for example, by etching, a step well known in the art. Thus, the Fig. 3 device, if the wafer is of N-type conductivity, will be a basic diode configuration as the regrown region is of P-type conductivity.

Figure 4:
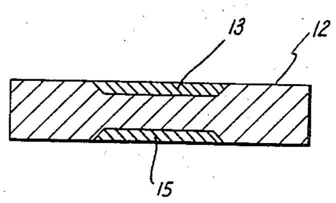
Fig. 4 is a cross-sectional view showing the silicon starting specimen with two regrown regions which is the basic configuration of a transistor.

In Fig. 4 there is shown the Fig. 3 device in which the fustion process and etching process have been twice performed to produce two regrown P-type regions 13 and 15 in the N-type silicon starting crystal 12. Thus, the Fig. 4 device is the basic configuration for a silicon P–N–P transistor.

The crux or essence of the present invention lies in the use of a boron-aluminum alloy in the alloy pellet 10. While it is well known that boron and aluminum individually are both acceptor impurities, it is believed that their combined use as an alloy to produce an acceptor-doped regrown region in a silicon starting crystal is new. When aluminum alone is used as the acceptor impurity, the P-type regrown region is unsatisfactory in some applications for the following reasons. Aluminum has a rejection ratio of the order of magnitude .001 with silicon and, therefore, produces a relatively high resistivity regrown region in the silicon. Further, the resistivity of the regrown region so produced has a tendency to vary with depth.

Boron, on the other hand, which is also well known as an acceptor impurity, while it produces a better regrown region, presents difficulty when one attempts to create the regrown region. Boron has a higher melting point than silicon and, therefore, will not wet the surface of the silicon and, hence, will not dissolve the same upon being melted.

However, the union of aluminum and boron into an acceptor impurity alloy overcomes these difficulties and has further inherent advantages. To begin with aluminum with boron added thereto seems to have a greater power to wet silicon. Further, the regrown region thus produced, containing boron and aluminum atoms (more boron than aluminum for reasons which will hereinafter be discussed), is of low resistivity and also has a resistivity which is more uniform with depth than an aluminum-doped regrown region. This results in a regrown region of a transistor whose $\gamma$, where $\gamma$ is defined as $$\frac{I_p}{I_p+I_n}$$

is closer to unity than if pure aluminum had been used, $I_p$ being representative of the hole current and $I_n$ of the electron current, and further, $\gamma$ remains close to unity with higher current densities than with a pure aluminum fusion junction transistor. Thus, boron increases the conductivity of the emitter region allowing higher currents to be produced from the emitter region without upsetting the equilibrium of the doped P-type regrown region of the emitter if such is being used as a transistor, as zone 13 of Fig. 4, for example. This further makes possible greater conductivity modulation in diodes, as for example in the device of Fig. 3.

As was stated hereinabove, the rejection ratio of aluminum in silicon is approximately .001. By the same token the rejection ratio of boron in silicon is approximately unity. This means that the ratio of boron to silicon in the solution to that of boron to silicon in the solidified regrown region is approximately 1:1. Consequently, one thousand times as much boron will remain in the regrown region 13 as will aluminum, should the alloy pellet 10 be made of one-half aluminum and one-half boron. This is, of course, not a practical alloy; an alloy of 3 percent boron and 97 percent aluminum is probably the maximum amount of boron which can be forced into solution. Therefore, an alloy of less than 3 percent boron, remainder aluminum, may also be used.

The concentration of active impurity precipitating back onto the silicon starting crystal equals the concentration of the material in the alloy times the constant $K_1$, where $K_1$ equals $$\frac{C_{\text{solid solution}}}{C_{\text{liquid alloy}}}$$

$K_1$ being the "rejection ratio," or "segregation constant."

There has thus been described a novel method of producing fused junction silicon semiconductor devices having low resistivity regrown regions.

What is claimed as new is:

1. In a fused junction silicon semiconductor device the combination comprising: a first region of N-type conductivity; and an active impurity-doped regrown region of P-type conductivity in one face of said first region, said regrown region containing atoms of boron and aluminum, the number of boron atoms present in said regrown region being substantially equal to the segregation constant $k_1$ of boron in silicon times the concentration of boron in the liquid solution, said segregation constant being defined as the concentration of boron atoms in the solid solution of silicon and boron divided by the concentration of boron atoms in the liquid solution of boron, aluminum and silicon.

2. In a semiconductor device the combination comprising: a silicon semiconductor specimen; and an active impurity-doped regrown P-type conductivity region in one face of said specimen, said regrown region containing atoms of boron and aluminum, the number of boron atoms present in said regrown region being substantially equal to the segregation constant $k_1$ of boron in silicon times the concentration of boron in the liquid solution, said segregation constant being defined as the concentration of boron atoms in the solid solution of silicon and boron divided by the concentration of boron atoms in the liquid solution of boron, aluminum and silicon.

3. A fused junction silicon semiconductor translating device comprising: at least one N-type conductivity region; and at least one active impurity-doped regrown P-type region in said N-type region, said regrown region containing atoms of boron and aluminum, the number of boron atoms present in said regrown region being substantially equal to the segregation constant $k_1$ of boron in silicon times the concentration of boron in the liquid solution, said segregation constant being defined as the concentration of boron atoms in the solid solution of silicon and boron divided by the concentration of boron atoms in the liquid solution of boron, aluminum and silicon.

4. In a fused junction semiconductor translating device wherein an alloy is fused to a semi-conductor body, the combination comprising: an N-type silicon semiconductor body, a substantially single crystal P-type region in at least a portion of one face of said body and separated from said body by a P–N junction, said P-type region containing atoms of boron and aluminum, the number of boron atoms present in said regrown region being substantially equal to the segregation constant $k_1$ of boron in silicon times the concentration of boron in said alloy, said segregation constant being defined as the concentration of boron atoms in the solid solution of silicon and boron divided by the concentration of boron atoms in the liquid solution of boron, aluminum and silicon.

5. In a fused junction semiconductor translating device wherein an alloy is fused to a semiconductor body the combination comprising: a silicon semiconductor crystal body, a substantially single crystal regrown region in at least one surface of said body and separated from said body by a P–N junction, said regrown region containing atoms of boron and aluminum, the number of boron atoms present in said regrown region being substantially equal to the segregation constant $k_1$ of boron in silicon times the concentration of boron in said alloy, said segregation constant being defined as the concentration of boron atoms in the solid solution of silicon and boron divided by the concentration of boron atoms in the liquid solution of boron, aluminum and silicon.

6. In a fused junction semiconductor translating device wherein an alloy is fused to a semiconductor body the combination comprising: a silicon semiconductor crystal body, a substantially single crystal regrown region in at least one surface of said body and separated from said body by a P–N junction, said regrown region containing atoms of boron and aluminum, the number of boron atoms present in said regrown region being substantially equal to the segregation constant $k_1$ of boron in silicon times the concentration of boron in said alloy, said segregation constant being defined as the concentration of boron atoms in the solid solution of silicon and boron divided by the concentration of boron atoms in the liquid solution of aluminum, boron and silicon, said alloy being a substantially boron-saturated aluminum-boron alloy.

References Cited in the file of this patent

UNITED STATES PATENTS

| | | |
|---|---|---|
| 2,701,326 | Pfann et al. | Feb. 1, 1955 |
| 2,742,383 | Barnes et al. | Apr. 17, 1956 |
| 2,759,133 | Mueller | Aug. 14, 1956 |